(12) United States Patent
Shao et al.

(10) Patent No.: US 11,348,781 B2
(45) Date of Patent: May 31, 2022

(54) WAFER ANNEALING METHOD

(71) Applicant: NEXCHIP SEMICONDUCTOR CO., LTD., Anhui (CN)

(72) Inventors: Yingya Shao, Anhui (CN); Houjen Chu, Anhui (CN); Binghui Bao, Anhui (CN)

(73) Assignee: NEXCHIP SEMICONDUCTOR CO., LTD., Anhui (CN)

(*) Notice: Subject to any disclaimer, the term of this patent is extended or adjusted under 35 U.S.C. 154(b) by 33 days.

(21) Appl. No.: 16/925,871

(22) Filed: Jul. 10, 2020

(65) Prior Publication Data

US 2021/0351029 A1 Nov. 11, 2021

(30) Foreign Application Priority Data

May 6, 2020 (CN) .................. 2020103724890.0

(51) Int. Cl.
 *H01L 21/02* (2006.01)
 *H01L 21/225* (2006.01)

(52) U.S. Cl.
 CPC .... *H01L 21/02005* (2013.01); *H01L 21/2253* (2013.01)

(58) Field of Classification Search
 CPC ....... H01L 21/02354; H01L 21/02675–02686; H01L 21/0275; H01L 21/268–2686; H01L 21/428; H01L 23/5254; H01L 23/5258; H01L 39/249; H01L 51/0027; H01L 2021/60112; H01L 2021/60292; H01L 21/324; H01L 21/477; H01L 27/1285; H01L 21/3225; H01L 21/02005; H01L 21/2253; H01L 21/67; G05D 23/00
 See application file for complete search history.

(56) References Cited

U.S. PATENT DOCUMENTS 6,143,071 A * 11/2000 Aihara ................ C30B 33/00
                                                117/89
2006/0183290 A1* 8/2006 Kamada ................ H01L 22/14
                                                438/300

* cited by examiner

*Primary Examiner* — Cuong B Nguyen
(74) *Attorney, Agent, or Firm* — Global IP Services; Tianhua Gu

(57) ABSTRACT

The present disclosure provides a wafer annealing method, including: preparing a wafer, the wafer includes a plurality of regions concentrically disposed on the wafer; heating the plurality of regions, the heating process includes a plurality of heating stages, each of the heating stages has a different heating rate, temperatures of the plurality of regions vary in each of the heating stages; performing heat preservation on the plurality of regions; and cooling the plurality of regions through blowing nitrogen. The wafer annealing method can improve the electrical uniformity of the wafer.

9 Claims, 7 Drawing Sheets

```
Preparing a wafer, the wafer includes a plurality of
regions concentrically distributed toward an edge          S101
        along a center of the wafer

↓

Performing rapid thermal processing on the wafer           S102
```

WAFER ANNEALING METHOD

CROSS REFERENCES TO RELATED APPLICATIONS

This application claims the benefit of priority to Chinese Patent Application No. CN2020103724890, filed with CNIPO on May 6, 2020, the contents of which are incorporated herein by reference in its entirety.

TECHNICAL FIELD

The present disclosure relates to the technical field of semiconductor, and in particular, to a wafer annealing method.

BACKGROUND

Wafer is one of the most important materials in the semiconductor industry. Various circuit element structures may be formed on the wafers to form products with a specific electrical function. During current production, due to a uniformity difference of manufacturing devices, even if each process has extremely small uniformity, after a plurality of processes and testing, uniformity of electrical distribution of the wafer is obvious. The uniformity of electrical distribution will decrease yield and result in severe leakage of electricity at the edge of a wafer. A critical dimension (CD) is always adjusted by using a photolithographic process to relieve the problem. However, the photolithographic process has an obvious electrical improvement effect for only small-sized devices, the effect gradually fails as the size increases.

SUMMARY

The present disclosure provides a wafer annealing method to improve electrical uniformity of a wafer and increase the product yield.

The present disclosure proposes a wafer annealing method, including: preparing a wafer, the wafer includes a plurality of regions concentrically disposed on the wafer; heating the plurality of regions, the heating process includes a plurality of heating stages, each of the heating stages has a different heating rate, temperatures of the plurality of regions vary in each of the heating stages; performing heat preservation on the plurality of regions; and cooling the plurality of regions through blowing nitrogen.

Further, the plurality of regions includes a first region to a seventh region, and a temperature difference between two adjacent ones of the regions is 1-4° C.

Further, the first region to the seventh region is sequentially arranged from a center to an edge of the wafer.

Further, the plurality of heating stages include a first stage to a fifth stage, heating rates of the first stage to the fifth stage are sequentially the third stage, the fourth stage, the first stage, the fifth stage, and the second stage in descending order.

Further, the heating rate of the first stage is 33° C./s, the heating rate of the second stage is 10° C./s, the heating rate of the third stage is 75° C./s, the heating rate of the fourth stage is 50° C./s, and the heating rate of the fifth stage is 25° C./s.

Further, heating time of the first stage to the fifth stage are 10-12 s, 9-10 s, 5-6 s, 0.5-1 s, and 3-5 s, respectively.

Further, temperatures of the first region to the seventh region after each of the heating stages are as follows: temperatures of the first region to the seventh region after the first stage are: 390-410° C., 389-409° C., 388-408° C., 387-407° C., 386-406° C., 385-405° C., and 384-404° C., respectively; temperatures of the first region to the seventh region after the second stage are: 485-505° C., 484-504° C., 483-503° C., 482-502° C., 481-501° C., 480-500° C., and 479-499° C., respectively; temperatures of the first region to the seventh region after the third stage are: 870-890° C., 869-889° C., 868-888° C., 867-887° C., 866-886° C., 865-885° C., and 864-884° C., respectively; temperatures of the first region to the seventh region after the fourth stage are: 920-940° C., 919-939° C., 918-938° C., 917-937° C., 916-936° C., 915-935° C., and 914-934° C., respectively; and temperatures of the first region to the seventh region after the fifth stage are: 1020-1040° C., 1019-1039° C., 1018-1038° C., 1017-1037° C., 1016-1036° C., 1015-1035° C., and 1014-1034° C., respectively. A temperature near the center of the wafer is greater than a temperature away from the center of the wafer.

Further, heat preservation is performed on the first region to the seventh region for 10-20 seconds after the first stage and before the second stage.

Further, a time of period for the heat preservation is 10-15 seconds.

Further, a cooling rate is 35° C./s.

According to the wafer annealing method in the present disclosure, the wafer is divided into a plurality of regions, the plurality of regions are heated in stages, the heating rate varies in each stage, the temperature of each region also varies in each heating stage, and the temperature near the center of the wafer is greater than the temperature away from the center of the wafer. In this way, the electrical uniformity of the wafer is improved, a difference between chips on the wafer is relieved, electric leakage of the wafer is reduced, and the product yield is increased. In addition, the annealing method has wide applicability, and different temperatures may be set for the regions according to process adjustment.

DETAILED DESCRIPTION OF THE PREFERRED EMBODIMENTS

Figure 1:
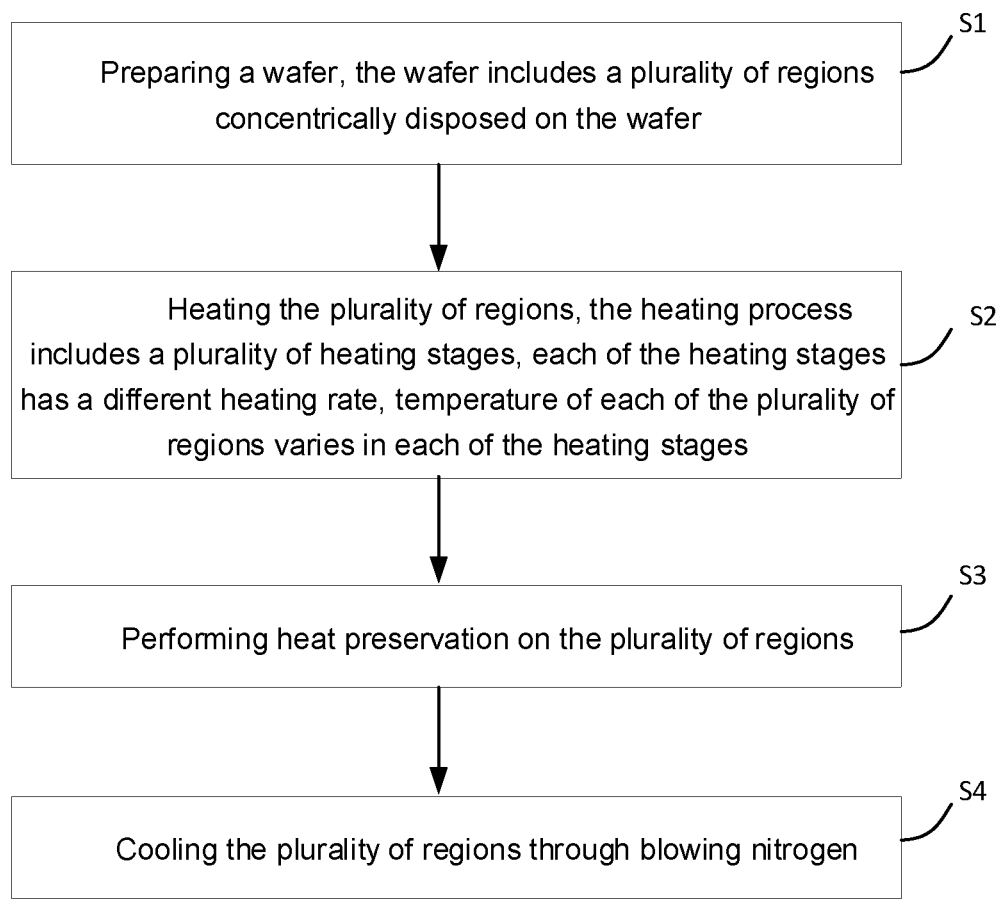
FIG. 1 is a flowchart of a wafer annealing method according to an embodiment.

The following describes the embodiments of the present disclosure through specific examples. A person skilled in the art can easily understand other advantages and effects of the present disclosure from the content disclosed in this specification. The present disclosure may also be implemented or applied through different specific embodiments. Various details in this specification may also be modified or changed based on different viewpoints and applications without departing from the spirit of the present disclosure.

It should be noted that the drawings provided in the embodiments only exemplify the basic idea of the present disclosure. Therefore, only the components related to the present disclosure are shown in the drawings, and are not drawn according to the quantity, shape, and size of the components during actual implementation. During actual implementation, the type, quantity, and proportion of the components may be changed, and the layout of the components may be more complicated.

In an embodiment, a wafer may be a wafer supported by any semiconductor material such as a silicon wafer, a sapphire wafer, or a silicon carbide wafer. Taking silicon wafer as an example, a size of the silicon wafer may have various sizes suitable for semiconductor substrate applications, such as 2 inches, 4 inches, 6 inches, 8 inches, or 12 inches.

Ion injection is a process of injecting charged and energetic particles into a wafer. Compared with a diffusion process, a main benefit of ion injection lies in more accurate control of impurity doping, repeatability, and a low process temperature. The ion injection process is to accelerate ions by using an electric field in a vacuum system and change a movement direction of the ions by using a magnetic field, so as to control the ions to be injected into the wafer with a specific energy to form a surface layer (that is, an injection layer) with special properties in a selected region, thereby implementing doping. A main side effect of the ion injection process is fracture or damage of semiconductor lattice caused by ion collision. In order to eliminate the damage, a wafer needs to be heated at an appropriate time and temperature to eliminate a lattice defect and internal stress in the wafer and restore integrity of lattices, so that injected doped atoms are diffused to replacement positions to generate electrical characteristics. Rapid heat processing may be used to activate doped elements in semiconductor materials and restore an amorphous structure caused by ion injection to a complete lattice structure.

As shown in FIG. 1, an embodiment provides a wafer annealing method, including the following steps.

S1: Preparing a wafer, the wafer includes a plurality of regions concentrically disposed on the wafer.

S2: Heating the plurality of regions, the heating process includes a plurality of heating stages, each of the heating stages has a different heating rate. The temperature of each of the plurality of regions varies in each of the heating stages.

S3: Performing heat preservation on the plurality of regions.

S4: Cooling the plurality of regions through blowing nitrogen.

Figure 2:
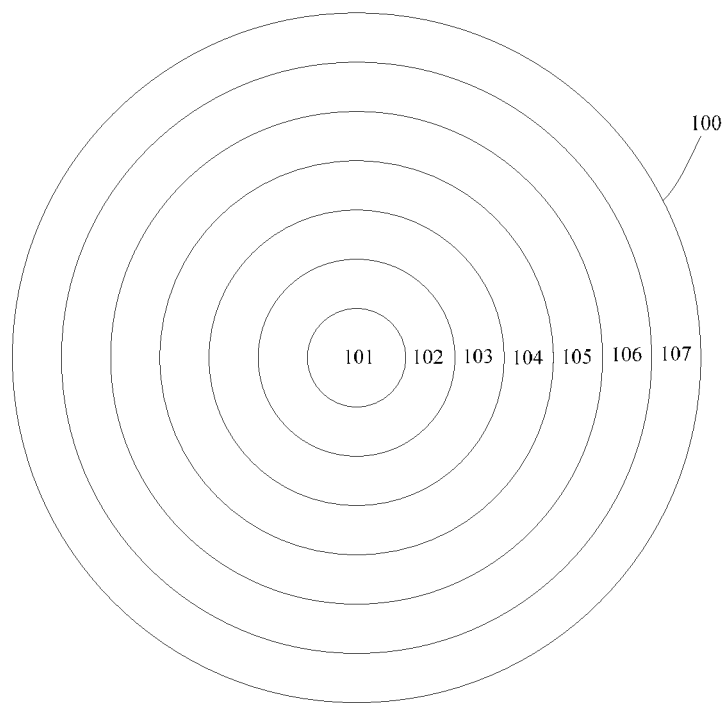
FIG. 2 is a brief schematic diagram of a plurality of regions on a wafer according to an embodiment.

As shown in FIG. 2, in step S1, in this embodiment, a wafer 100 is divided into a plurality of regions. The plurality of regions is distributed toward an edge from a center of the wafer 100. In this embodiment, the wafer 100 may be divided into seven regions, for example. The seven regions include one circular region and six annular regions, for example. The seven regions are sequentially arranged from the center to the edge of the wafer 100. Specifically, a first region 101 is a circular region, and a second region 102 to a seventh region 107 are annular regions. The second region 102 is disposed around an outer periphery of the first region 101, the third region 103 is disposed around an outer periphery of the second region 102, the fourth region 104 is disposed around an outer periphery of the third region 103, the fifth region 105 is disposed around an outer periphery of the fourth region 104, the sixth region 106 is disposed around an outer periphery of the fifth region 105, and the seventh region 107 is disposed around an outer periphery of the sixth region 106. By dividing wafer 100 into seven regions independent of each other, the temperature of each region can independently controlled.

As shown in FIG. 2, a radius of the first region 101 is equal to an inner diameter of the second region 102, and an inner diameter of an outer annular region is equal to an outer diameter of an adjacent inner annular region. For example, an inner diameter of the second region 102 is equal to a radius of the first region 101, an outer diameter of the second region 102 is equal to an inner diameter of the third region 103, and an outer diameter of the third region 103 is equal to an inner diameter of the fourth region 104, and so on, so as to avoid an obvious temperature transition zone between two adjacent region.

Figure 3:
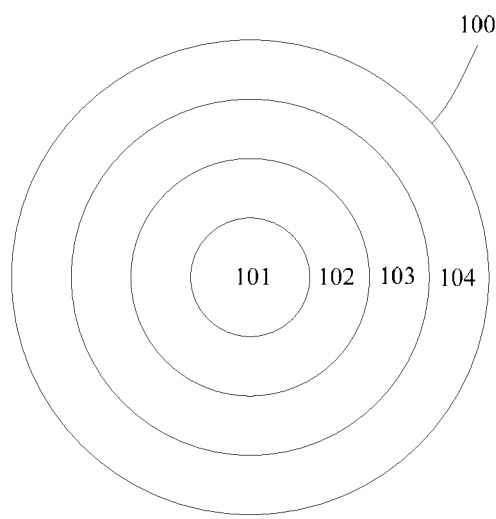
FIG. 3 is another brief schematic diagram of a plurality of regions on a wafer according to an embodiment.

As shown in FIG. 3, in some embodiments, a plurality of regions may be disposed on the wafer 100 according to distribution of heaters in a furnace. For example, the wafer may be divided into four regions, that is, the first region 101 to the fourth region 104. The first region 101 is a circular region, and the second region 102 to the fourth region 104 are annular regions. The three annular regions and the circular region are concentrically disposed, and are distributed along the outer periphery of the first region 101. In some embodiments, the wafer 100 may also be divided into two, three, five, or six regions. It should be noted that a number of regions is not limited thereto.

Figure 4:
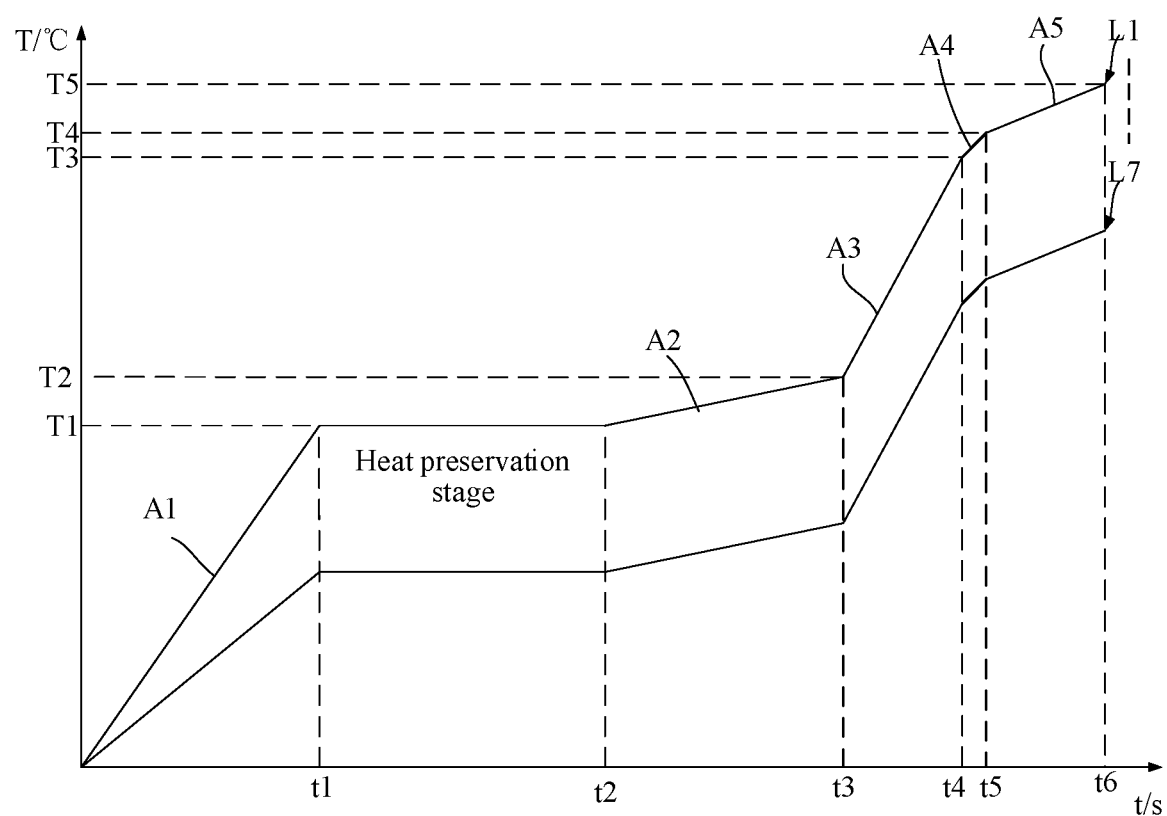
FIG. 4 is a brief schematic diagram of a plurality of heating stages of a wafer according to an embodiment.

As shown in FIG. 2 and FIG. 4, FIG. 4 is a schematic diagram of heating curves of the regions. It should be noted that a heating curve L1 represents a heating process of the first region 101, and a heating curve L7 represents a heating process of the seventh region 107. FIG. 4 does not show heating curves of the second region 102 to the sixth region 106. In step S2, when the wafer 100 is disposed in an annealing furnace, the wafer 100 is heated through a plurality of heating stages, for example, the plurality of regions on the wafer 100 may be heated through five heating stages, so as to perform annealing. In this embodiment, after the five heating stages, the plurality of regions on the wafer 100 has different temperatures. A temperature near the center of the wafer 100 is greater than a temperature away from the center of the wafer 100, that is, the temperature gradually decreases from the center to the edge of the wafer 100. In this embodiment, a temperature difference between two adjacent regions is 1-4° C., for example, 2° C. or 3° C.

As shown in FIG. 2 and FIG. 4, in this embodiment, when the wafer 100 is disposed in the annealing furnace, heating of a first stage A1 is first performed at a heating rate of, for example, 33° C./s for 10-12 s, for example, 11 s, so that each region reaches a preset temperature. The temperature of the wafer 100 gradually decreases from the first region 101 to the seventh region 107. For example, after the first stage A1, the temperature of the first region 100 may be 390-410° C., for example, 396° C.; the temperature of the second region 102 may be 389-409° C., for example 395° C.; the temperature of the third region 103 may be 388-408° C., for example, 394° C.; the temperature of the fourth region 104 may be 387-407° C., for example, 393° C.; the temperature of the fifth region 105 may be 386-406° C., for example 392° C.; the temperature of the sixth region 106 may be 385-405° C., for example, 391° C., and the temperature of the seventh region 107 may be 384-404° C., for example, 390° C. In this embodiment, after the first heating stage A1, the temperatures of the first region 101 to the seventh region 107 gradually decrease, and the temperature difference between two adjacent regions is 1° C.

As shown in FIG. 2 and FIG. 4, after the first stage A1 is completed, heat preservation may be performed for 10-20 s, for example, 15 s, and then heating of a second stage A2 is performed on the wafer 100 at a heating rate of, for example, 10° C./s for 9-10 s, for example, 10.2 s. After the second stage A2, the temperature of the first region 101 may be 485-505° C., for example 498° C.; the temperature of the second region 102 may be 484-504° C., for example 497° C.; the temperature of the third region 103 may be 483-503° C., for example, 496° C.; the temperature of the fourth region 104 may be 482-502° C., for example, 495° C.; the temperature of the fifth region 105 may be 481-501° C., for example 494° C.; the temperature of the sixth region 106 may be 480-500° C., for example, 493° C.; and the temperature of the seventh region 107 may be 479-499° C., for example, 492° C. In this embodiment, after the second stage A2, the temperatures of the first region 101 to the seventh region 107 gradually decrease, and the temperature difference between two adjacent regions is 1° C.

As shown in FIG. 2 and FIG. 4, after the second stage A2 is completed, heating of a third stage A3 is performed on the wafer 100 at a heating rate of, for example, 75° C./s for 5-6 s, for example, 5.2 s. After the third stage A3, the temperature of the first region 101 may be 870-890 C., for example, 888° C.; the temperature of the second region 102 may be 869-889° C., for example 887° C.; the temperature of the third region 103 may be 868-888° C., for example, 886° C.; the temperature of the fourth region 104 may be 867-887° C., for example, 885° C.; the temperature of the fifth region 105 may be 866-886° C., for example 884° C.; the temperature of the sixth region 106 may be 865-885° C., for example, 883° C.; and the temperature of the seventh region 107 may be 864-884° C., for example, 882° C. In this embodiment, after the third stage A3, the temperatures of the first region 101 to the seventh region 107 gradually decrease, and the temperature difference between two adjacent regions is 1° C.

As shown in FIG. 2 and FIG. 4, after the third stage A3 is completed, heating of a fourth stage A4 is performed on the wafer 100 at a heating rate of, for example, 50° C./s for 0.5-1 s, for example, 0.84 s. After the fourth stage A4, the temperature of the first region 101 may be 920-940° C., for example, 930° C.; the temperature of the second region 102 may be 919-939° C., for example 929° C.; the temperature of the third region 103 may be 918-938° C., for example, 928° C.; the temperature of the fourth region 104 may be 917-937° C., for example, 927° C.; the temperature of the fifth region 105 may be 916-936° C., for example 926° C.; the temperature of the sixth region 106 may be 915-935° C., for example, 925° C.; and the temperature of the seventh region 107 may be 914-934° C., for example, 924° C. In this embodiment, after the fourth stage A4, the temperatures of the first region 101 to the seventh region 107 gradually decrease, and the temperature difference between two adjacent regions is 1° C.

As shown in FIG. 2 and FIG. 4, after the fourth stage A4 is completed, heating of a fifth stage A5 is performed on the wafer 100 at a heating rate of, for example, 25° C./s for 3-5 s, for example, 4 s. After the fifth stage A5, the temperature of the first region 101 may be 1020-1040° C., for example, 1030° C.; the temperature of the second region 102 may be 1019-1039° C., for example 1029° C.; the temperature of the third region 103 may be 1018-1038° C., for example, 1028° C.; the temperature of the fourth region 104 may be 1017-1037° C., for example, 1027° C.; the temperature of the fifth region 105 may be 1016-1036° C., for example 1026° C.; the temperature of the sixth region 106 may be 1015-1035° C., for example, 1025° C.; and the temperature of the seventh region 107 may be 1014-1034° C., for example, 1024° C. In this embodiment, after the fifth stage A5, the temperatures of the first region 101 to the seventh region 107 gradually decrease, and the temperature difference between two adjacent regions is 1° C.

As shown in FIG. 2 and FIG. 4, the heating curve L1 represents the heating process of the first region 101, and the heating curve L7 represents the heating process of the seventh region 107. After the five heating stages, the first region 101 has the highest temperature and the seventh region 107 has the lowest temperature. That is, the temperature gradually decreases from the first region 101 to the seventh region 107.In other words, the temperature near the center of the wafer 100 is higher than the temperature away from the center of the wafer 100. It can be learned from the heating curve L1 or L7 that the heating rate of the third heating stage A3 is greater than the heating rate of the fourth heating stage A4, the heating rate of the fourth heating stage A4 is greater than the heating rate of the first heating stage A1, the heating rate of the first heating stage A1 is greater than the heating rate of the fifth heating stage A5, and the heating rate of the fifth heating stage A5 is greater than the heating rate of the second heating stage A2.

Figure 5:
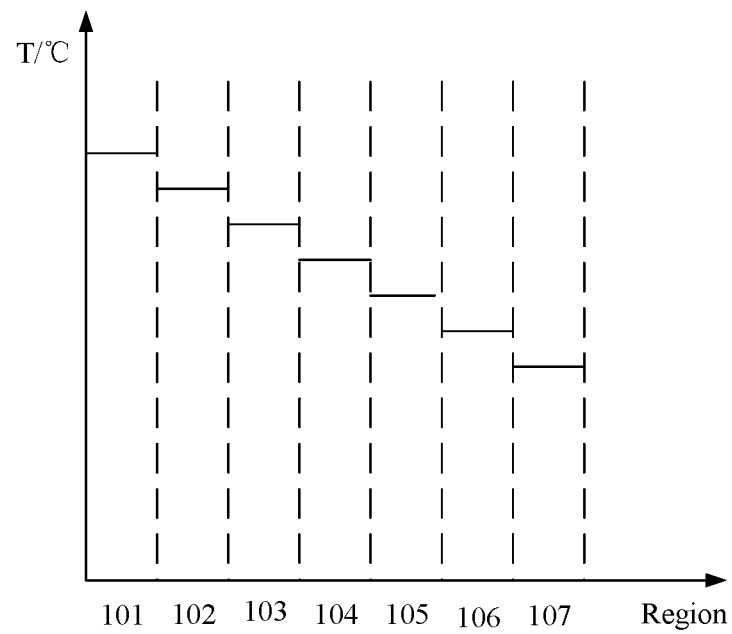
FIG. 5 shows temperature of each region after step S2 is completed according to an embodiment.

FIG. 5 shows temperature of each of the regions after step S2. It can be seen that the temperature gradually decreases from the first region 101 to the seventh region 107.That is, the first region 101 has the highest temperature, for example, 1040° C., and the seventh region 107 has the lowest temperature, for example, 1014° C.

Figure 6:
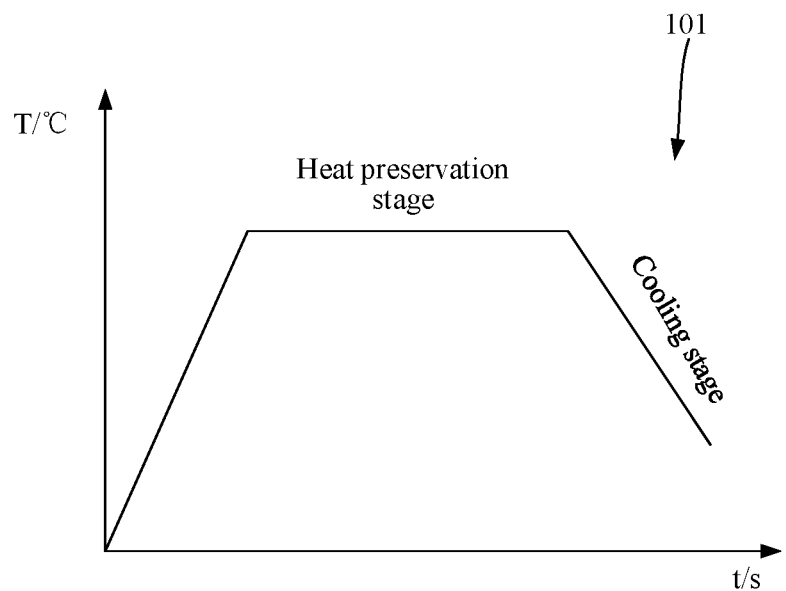
FIG. 6 is a brief schematic diagram of a heat preservation stage and a cooling stage of a first region according to an embodiment.

As shown in FIG. 6, in steps S3-S4, after step S2 is completed, that is, after all of the regions in the wafer 100 are heated to corresponding temperatures, heat preservation may be further performed for 10-15 s, for example, 12 s, and then cooling is performed, that is, all of the regions on the wafer 100 are cooled, for example, through nitrogen blowing. A cooling rate of the wafer 100 is, for example, 35° C./s. It should be noted that FIG. 6 shows only a heat preservation stage and a cooling stage of the first region 101.

In this embodiment, the wafer 100 is heated through five heating stages. In some embodiments, the wafer 100 may be heated through three or four heating stages. It should be noted that a number of the heating stages provided in the present disclosure is not limited thereto.

Figure 7A:
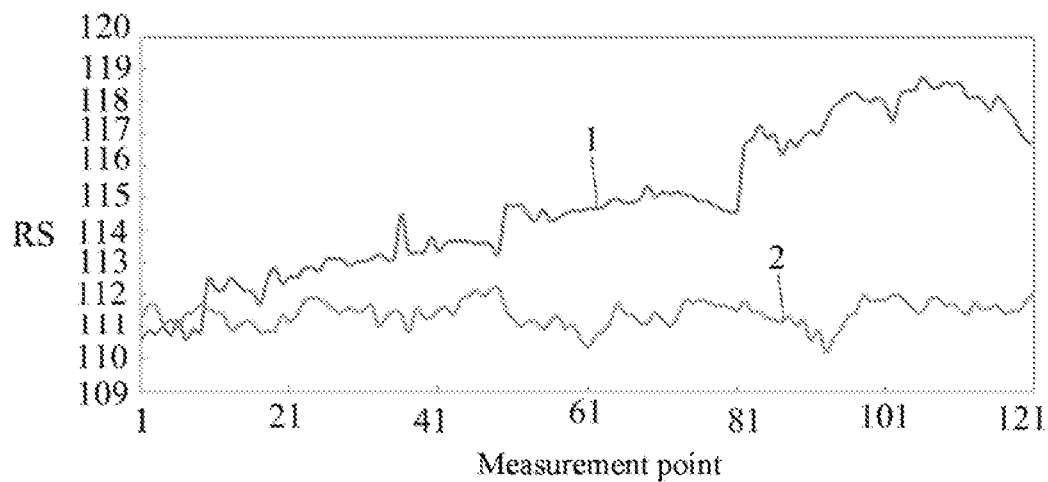
FIG. 7A is a schematic diagram of a resistance curve of a wafer according to an embodiment.
Figure 7B:
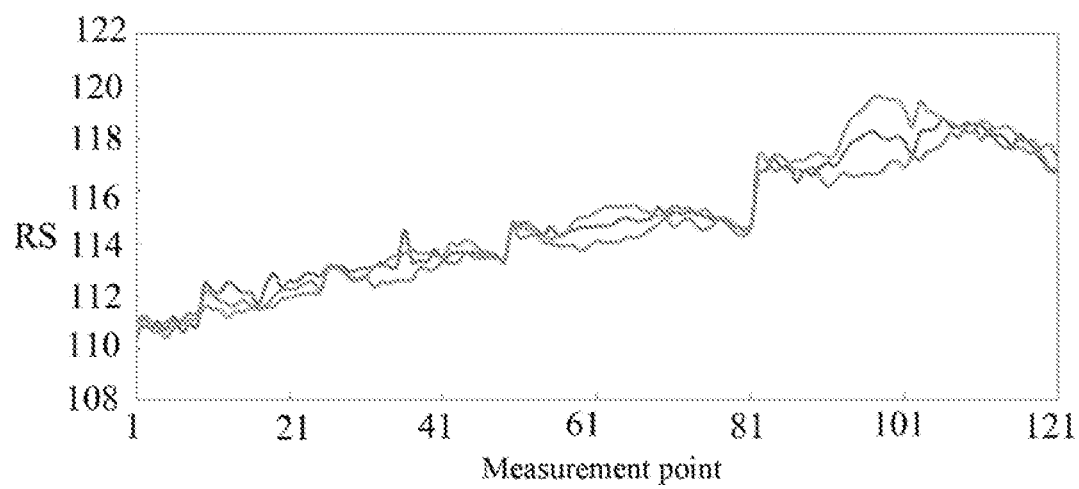
FIG. 7B is a repeated testing diagram of a resistance of a wafer according to an embodiment.

As shown in FIG. 7A to FIG. 7B, in FIG. 7A, a curve 1 is a test curve obtained by using the annealing method in this embodiment, and a curve 2 is a standard test curve obtained by using the prior art. Comparing curve 1 with curve 2, it can be seen that, since the temperatures of the plurality of regions are controlled (that is, the temperature of the wafer gradually decreases from the center region to the edge region on the wafer), a plurality of heating stages are set, and each of the heating stages have a different heating rate, a resistance of the wafer gradually increases from the center to the edge, which conforms to a change rule of the resistance in the wafer, and reduces a thermal budget of the edge region on the wafer surface. Through a plurality of times of verification by using the annealing method in this embodiment, it can be seen from FIG. 7B that, curves obtained after three verification tests are basically consistent, and have good coincidence, high sensitivity, and good reproducibility. In this embodiment, a resistance trend curve refers to a curve formed by the following way: taking a plurality of points on a surface of the wafer according to an ascending order of distance from the center of the wafer, measuring resistances of the corresponding points, and connecting the resistances.

Figures 8, 9:
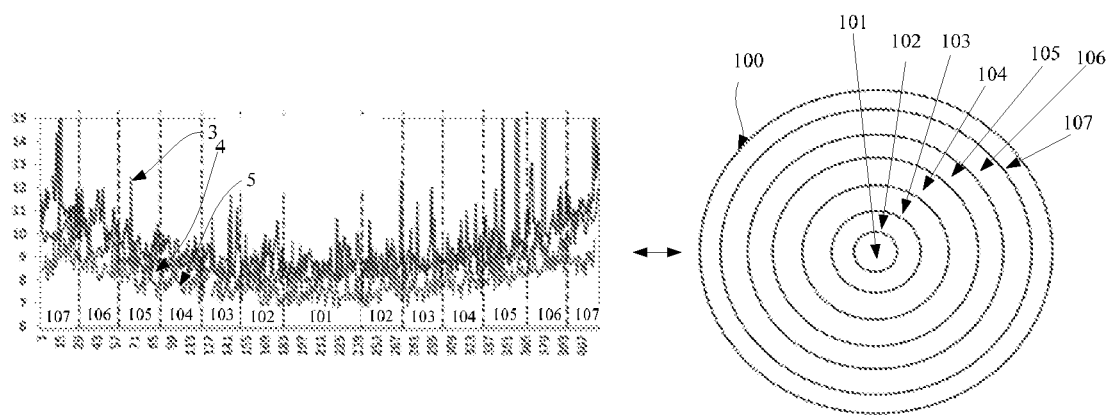
FIG. 8 is a curve diagram of current leakage testing of a wafer according to an embodiment.
FIG. 9 is a flowchart of a rapid wafer heating method according to an embodiment.

FIG. 8 shows an electric leakage test diagram of a wafer obtained in three manners. Curve 3 and curve 4 are test curves obtained by using the prior art. Curve 3 is a test curve obtained without setting a plurality of exposure processes, curve 4 is a test curve obtained by setting a plurality of exposure processes, and curve 5 is a test curve obtained by using the annealing method in this embodiment. Comparing the three curves, it can be seen that curve 5 is located below curve 3 and curve 4. That is, a surface of the wafer obtained by using the annealing method in this embodiment has good electrical uniformity, and electric leakage in each region is reduced. In other words, overall electric leakage of the wafer is significantly reduced, and the yield of the wafer is improved.

As shown in FIG. 9, an embodiment proposes a rapid wafer heating method, including the following steps.

S101: Preparing a wafer, the wafer includes a plurality of regions concentrically distributed toward an edge along a center of the wafer.

S102: Performing a rapid thermal processing on the wafer.

As shown in FIG. 2, in step S101, the wafer 100 includes a plurality of regions concentrically distributed from the center to the edge of the wafer 100. Specifically, a second region 102 is disposed around an outer periphery of a first region 101, a third region 103 is disposed around an outer periphery of the second region 102, and a fourth region 104 is disposed around an outer periphery of the third region 103, and so on. The wafer 100 is divided into one circular region and six annular regions. In this embodiment, the plurality of regions is independent of each other, and all of the regions may be heated independently or simultaneously.

In step S102, during rapid thermal processing of the wafer, the plurality of regions on the wafer has different temperatures, and a temperature at the center of the wafer is greater than a temperature at an edge of the wafer.

In this embodiment, rapid thermal processing may include four or five heating stages, for example. An annealing temperature used in rapid thermal processing is, for example, 900-1100° C., for example 1000° C., an annealing time is 5-60 s, for example 30 s, atmosphere may be N2, and a gas flow rate is 10-30 slm, for example, 20 slm.

In this embodiment, performing rapid thermal processing on the wafer can not only reduce an edge temperature of the wafer but also increase electrical uniformity of the wafer and improve a product yield.

Figure 10:
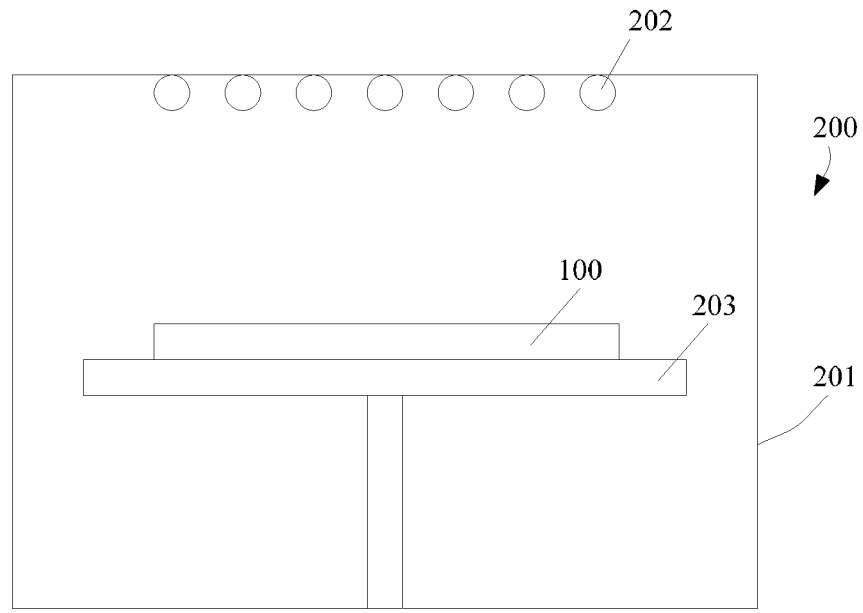
FIG. 10 is a brief schematic diagram of an annealing device according to an embodiment.

As shown in FIG. 10, an embodiment further provides an annealing device 200. The annealing device 200 includes a cavity 201. A plurality of heating units 202 is disposed on the top of the cavity 201. The plurality of heating units 202 are configured to perform independent annealing on a plurality of regions on a to-be-annealed wafer. A wafer fixing apparatus 203 is disposed at the bottom of the cavity 201, and the wafer fixing apparatus 203 is configured to carry one or more wafers.

Figure 11:
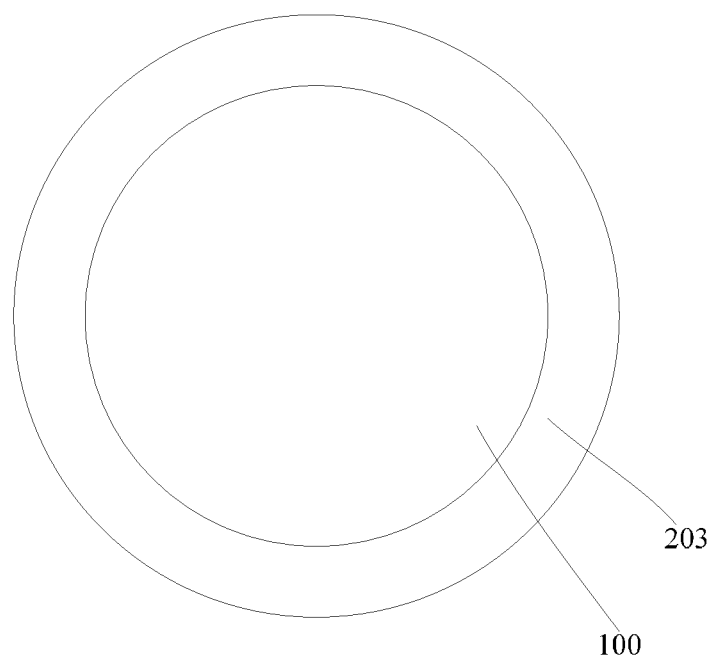
FIG. 11 is a top view of a wafer fixing apparatus according to an embodiment.

As shown in FIG. 10 to FIG. 11, in this embodiment, one wafer 100 is carried on the wafer fixing apparatus 203. Each of the wafers 100 includes a plurality of regions concentrically distributed toward an edge of the wafer 100 from a center of the wafer 100. In this embodiment, the plurality of regions on the wafer 100 is heated by using a plurality of heating units 202 for annealing. The heating unit 202 may be, for example, a laser or a lamp. It should be noted that the plurality of regions may be heated by using the plurality of heating units 202, so that the plurality of regions have different temperatures, and a temperature of the center of the wafer 100 is greater than a temperature of the edge of the wafer 100. In this embodiment, through the annealing device 200, an annealing temperature of the wafer 100 may reach 950-1050° C., for example, and an annealing time may be 32-36 s, for example. In some embodiments, a plurality of wafers 100 may be carried on the wafer fixing apparatus 203.

In summary, according to the wafer annealing method in the present disclosure, the wafer is heated through a plurality of heating stages, and from the first heating stage, the temperature of the wafer surface gradually decreases from the center to the edge, which increases electrical uniformity of the wafer, relieves a difference between chips on the wafer, reduces electric leakage of the wafer, and increases the product yield. In addition, the annealing method has a wide application range, and may be applied to large-sized and small-sized products.

The foregoing descriptions are merely preferred embodiments of this application and descriptions of technical principles used. A person skilled in the art should understand that the scope of this application is not limited to technical solutions formed by specific combinations of the foregoing technical features, and further includes other technical solutions formed by any combination of the foregoing technical features or equivalent features without departing from the inventive concept, for example, technical solutions formed by replacing the foregoing features with technical features disclosed in this application and (but not limited to) having similar functions.

Except the technical features described in this specification, all other features are known to those skilled in the art, and to highlight the innovative features of the present disclosure, the foregoing technical features are not described herein again.

What is claimed is:

1. A wafer annealing method, comprising:
preparing a wafer, wherein the wafer includes a plurality of regions concentrically disposed on the wafer;
heating the plurality of regions, wherein the heating includes a plurality of heating stages, each of the plurality heating stages has a different heating rate, a temperature of each of the plurality of regions varies in each other of the plurality heating stages;
performing heat preservation on the plurality of regions;
cooling the plurality of regions through blowing nitrogen; and
wherein the plurality of heating stages comprise a first stage, a second stage, a third stage, a fourth stage, and a fifth stage, heating rates of the third stage, the fourth stage, the first stage, the fifth stage, and the second stage are sequentially in descending order.

2. The annealing method as in claim 1, wherein the plurality of regions comprises a first region, a second region, a third region, a fourth region, a fifth region, a sixth region, and a seventh region, and a temperature difference between two adjacent ones of the plurality of regions is 1-4° C.

3. The annealing method as in claim 2, wherein the first region to the seventh region is sequentially arranged from a center to an edge of the wafer.

4. The annealing method as in claim 2, wherein the heating rate of the first stage is 33° C./s, the heating rate of the second stage is 10° C./s, the heating rate of the third stage is 75° C./s, the heating rate of the fourth stage is 50° C./s, and the heating rate of the fifth stage is 25° C./s.

5. The annealing method as in claim 4, wherein heating time of the first stage to the fifth stage are 10-12s, 9-10s, 5-6s, 0.5-1s, and 3-5s, respectively.

6. The annealing method as in claim 4, wherein temperatures of the first region to the seventh region after each of the heating stages are as follows:

temperatures of the first region to the seventh region after the first stage are: 390-410° C., 389-409° C., 388-408° C., 387-407° C., 386-406° C., 385-405° C., and 384-404° C., respectively;

temperatures of the first region to the seventh region after the second stage are: 485-505° C., 484-504° C., 483-503° C., 482-502° C., 481-501° C., 480-500° C., and 479-499° C., respectively;

temperatures of the first region to the seventh region after the third stage are: 870-890° C., 869-889° C., 868-888° C., 867-887° C., 866-886° C., 865-885° C., and 864-884° C., respectively;

temperatures of the first region to the seventh region after the fourth stage are: 920-940° C., 919-939° C., 918-938° C., 917-937° C., 916-936° C., 915-935° C., and 914-934° C., respectively; and temperatures of the first region to the seventh region after the fifth stage are: 1020-1040° C., 1019-1039° C., 1018-1038° C., 1017-1037° C., 1016-1036° C., 1015-1035° C., and 1014-1034° C., respectively;

wherein a temperature near the center of the wafer is greater than a temperature away from the center of the wafer.

7. The annealing method as in claim 6, wherein heat preservation is performed on the first region to the seventh region for 10-20 seconds after the first stage and before the second stage.

8. The annealing method as in claim 1, wherein a time of period for the heat preservation is 10-15 seconds.

9. The annealing method as in claim 1, wherein a cooling rate is 35° C./s.

* * * * *